United States Patent
Iwasaki et al.

[11] Patent Number: 6,111,995
[45] Date of Patent: Aug. 29, 2000

[54] MULTI-OPTICAL-PATH PHOTOELECTRIC SWITCH

[75] Inventors: Koumei Iwasaki; Michiaki Oka, both of Osaka, Japan

[73] Assignee: Keyence Corporation, Osaka, Japan

[21] Appl. No.: 09/158,522

[22] Filed: Sep. 22, 1998

[30] Foreign Application Priority Data

May 7, 1998 [JP] Japan ................................ 10-164082

[51] Int. Cl.[7] .................................................. G02B 6/26
[52] U.S. Cl. ................................................................. 385/16
[58] Field of Search ................................................. 385/16

[56] References Cited

U.S. PATENT DOCUMENTS

| | | | |
|---|---|---|---|
| 5,450,158 | 9/1995 | Jessen et al. .......................... | 355/50 |
| 5,644,380 | 7/1997 | Jessen et al. .......................... | 355/50 |
| 6,016,959 | 1/2000 | Kamo et al. .......................... | 235/449 |

Primary Examiner—Akm E. Ullah
Attorney, Agent, or Firm—Sughrue, Mion, Zinn, Macpeak & Seas, PLLC

[57] ABSTRACT

A light emitting portion of a multi-optical-path photoelectric switch comprising: a predetermined number of light emitting devices for emitting lights; a first case having a male connector disposed at one end, a female connector diposed at the other end, a surface between both ends made of a light transmissive resin, the surface through which the lights from the light emitting devices pass; a fixing frame holding the first case, and having the substantialy same length as the first case; and a second case accommodating a portion of the fixing frame while a residual portion of the fixing frrame is projected therefrom, wherein the light emitting units are mechanically and electrically connected to one another by inserting the portion of the fixing frame thus projected of either of adjacent light emitting units into the second case of the other adjacent light emitting unit. A light receiving portion of the multi-optical-path photoelectric switch comprises the similar structure.

7 Claims, 6 Drawing Sheets

MULTI-OPTICAL-PATH PHOTOELECTRIC SWITCH

BACKGROUND OF THE INVENTION

The present invention relates to a multi-optical-path photoelectric switch having a light emitting portion incorporating a plurality of light emitting devices and a light receiving portion having the same number of light receiving devices as that of the light emitting devices.

As a photoelectric switch for detecting a predetermined area, a multi-optical-path photoelectric switch is known which is structured as shown in FIG. 10 and which incorporates optical paths, the number of which can be varied. FIG. 10 is a perspective view showing a multi-optical-path photoelectric switch having six optical paths or channels, the multi-optical-path photoelectric switch having a light emitting portion 51 and a light receiving portion 52 disposed opposite to each other. The light emitting portion 51 has six light emitting devices (not shown). The light receiving portion 52 has six light receiving devices 53a to 53f therein. The light emitting devices and the corresponding light receiving devices 53a to 53f are structured such that their optical paths coincide with each other. The light receiving portion 52 incorporates a main unit 54, an extension unit 55 which can be connected to the main unit 54 and mutually, and an end unit 56 which can be connected to the extension unit 55 and the main unit 54.

FIG. 11 is a diagram showing the assembled light receiving portion 52 of the multi-optical-path photoelectric switch shown in FIG. 10. The main unit 54 has a stepped portion in substantially the central portion thereof and incorporates a large-diameter portion 54a and a small-diameter portion 54b formed integrally with the large-diameter portion 54a. The small-diameter portion 54b has an engaging projection 54c and a guide groove 54d. The extension unit 55 has a stepped portion in substantially the central portion thereof and incorporates a hollow joint portion 55a and a light-receiving-portion joining portion 55c formed integrally with the joint portion 55a. An engaging hole 55b to which an engaging projection 54c of the main unit 54 is engaged is formed in the side surface of the hollow joint portion 55a. The light-receiving-portion joining portion 55c has an engaging projection 55d and a guide groove 55d. An engaging hole 56a to which the engaging projection 55d of the extension unit 55 is engaged is formed in the side surface of the end unit 56.

When the foregoing units are assembled into the multi-optical-path photoelectric switch, the small-diameter portion 54b of the main unit 54 is inserted into the joint portion 55a of the extension unit 55. Then, a projection (not shown) of the extension unit 55 is slid in the guide groove 54d so that the main unit 54 and the extension unit 55 are connected to each other. At this time, a female connector provided for either of the foregoing units and a male connector provided for the other unit are connected to each other. Moreover, the light-receiving-portion joining portion 55c of the extension unit 55 is inserted into the end unit 56 so as to slide a projection (not shown) of the end unit 56 in the guide groove 55e. Thus, the extension unit 55 and the end unit 56 are connected to each other. At this time, a female connector provided for either of the foregoing units and a male connector provided for the other unit are connected to each other. As a result, the main unit 54, the extension unit 55 and the end unit 56 are mechanically and electrically connected to one another.

Each of the main unit 54, the extension unit 55 and the end unit 56 of the multi-optical-path photoelectric switch shown in FIG. 10 is made of a member obtained by molding, for example, synthetic resin. Therefore, there arises problems in that realized rigidity is insufficient to obtain satisfactory mechanical durability against external oscillations and impact. If the number of units which must be connected to one another increases and thus the overall length of the multi-optical-path photoelectric switch is elongated, there arises a problem in that the strength of the intermediate portion of the multi-optical-path photoelectric switch for maintaining the connection among units becomes unsatisfactory.

SUMMARY OF INVENTION

In view of the foregoing, an object of the present invention is to provide a multi-optical-path photoelectric switch having satisfactory rigidity and mechanical strength for maintaining the connection among the units.

To solve the above-mentioned problem, according to the present invention, there is provided a multi-optical-path photoelectric switch comprising: a light emtting portion having plural light emitting units, each including, a predetermined number of light emitting devices for emitting lights, a first case having a male connector disposed at one end, a female connector diposed at the other end, a surface between both ends made of a light transmissive resin, the surface through which the lights from the light emitting devices pass, a fixing frame holding the first case, and having the substantialy same length as the first case, and a second case accommodating a portion of the fixing frame while a residual portion of the fixing frrame is projected therefrom, wherein the light emitting units are mechanically and electrically connected to one another by inserting the portion of the fixing frame thus projected of either of adjacent light emitting units into the second case of the other adjacent light emitting unit; and a light receiving portion having plural light receiving units, each including, the same number of light receiving devices as the light emitting devices, a first case having a male connector disposed at one end, a female connector diposed at the other end, a surface between both ends made of a light transmissive resin, the surface through which the lights pass to the light receiving devices, fixing frame holding the first case, and having the substantialy same length as the first case, and a second case accommodating a portion of the fixing frame while a residual portion of the fixing frrame is projected therefrom, wherein the light receiving units are mechanically and electrically connected to one another by inserting the portion of the fixing frame thus projected of either of adjacent light receiving units into the second case of the other adjacent light receiving unit.

According to the present invention, the overall body of the first case structured such that at least the surface adjacent to the optical paths of the light emitting devices or the light receiving devices is made of the light transmissive resin material is received and held by the fixing frame. Moreover, a portion of the fixing frame is accommodated by the second case. Thus, the units are formed. The units are mechanically and electrically connected to one another. Therefore, the fixing frame formed into a double wall structure because the fixing frame holds the first case is disposed to penetrate second cases of adjacent units. Therefore, the rigidity of the multi-optical-path photoelectric switch constituted by connecting the units to one another can be increased. Moreover, durability against external oscillations and impact can be improved. Even if the number of units which must be connected is increased and thus the overall length is elongated, the mechanical strength for maintaining the connection among the units can be increased.

DETAILED DESCRIPTION OF THE PREFERRED EMOBIDMENTS

Figure 1:
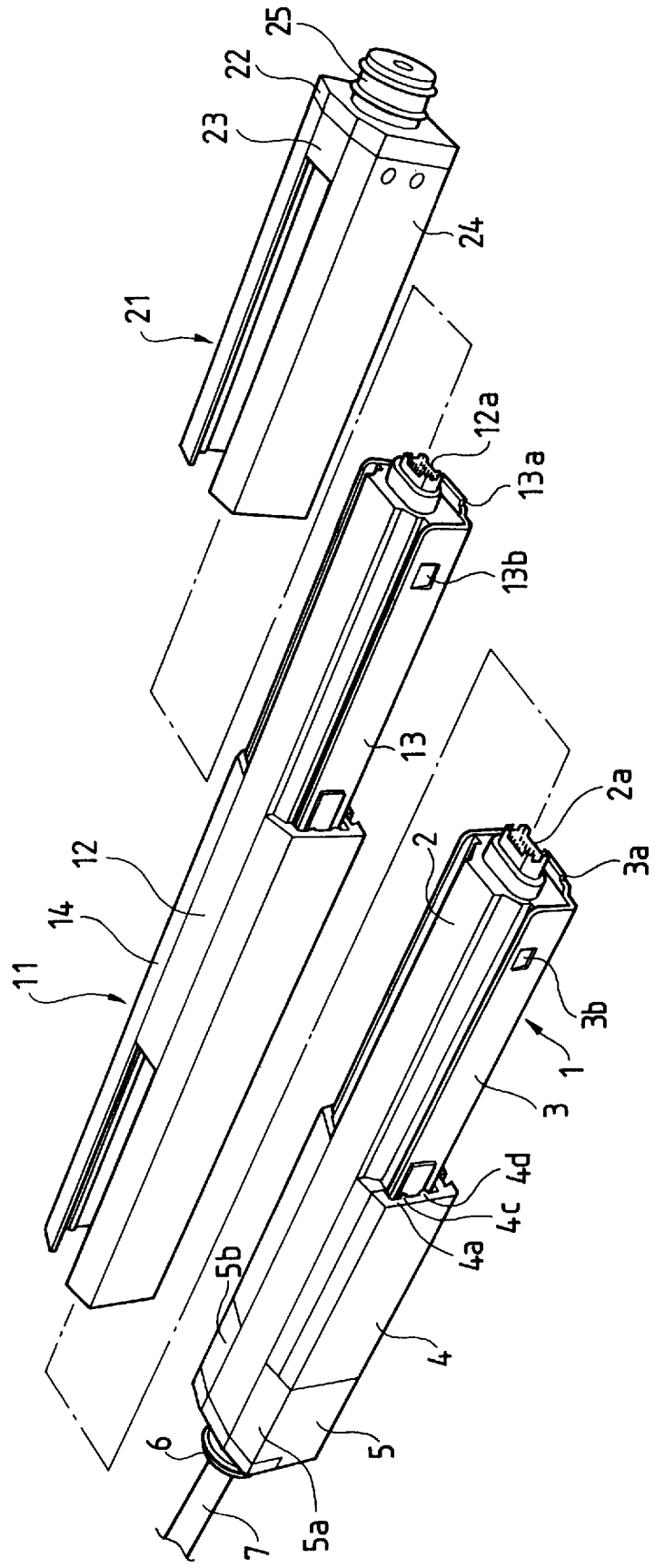
FIG. 1 is a diagram showing an assembled structure of an embodiment of a multi-optical-path photoelectric switch according to the present invention.

An embodiment of the present invention will now be described with reference to FIGS. 1 to 9. Note that the structures of a light emitting portion and a light receiving portion according to the present invention are the same except for the corresponding devices, that is, the light emitting devices or the light receiving devices. Therefore, only either of the structures will now be described. FIG. 2 is an exploded perspective view showing an inner case and a fixing frame which are elements of an extension unit. Referring to FIG. 2, an inner case 12 is made of a sealing material composed of a light transmissive synthetic resin and arranged to seal a required number of light emitting devices or light receiving devices, the inner case 12 serving as a first case. A male connector 12a is disposed at an end of the inner case 12. A female connector is disposed at another end of the inner case 12.

Projections 12b and 12c are formed on the side surface of the inner case 12. Projections 12d and 12e (not shown) are formed on another side surface of the inner case 12. Stepped portions 12f and 12g are formed from the top surface of the inner case 12. Spaces are formed between the two side surfaces and the stepped portions 12f and 12g.

A fixing frame 13 which has a U-shape cross sectional shape facing side is provided with engaging holes 13b to 13e in the two side surfaces thereof. The projections 12b to 12e of the inner case 12 are engaged to the engaging holes 13b to 13e of the fixing frame 13 so that only the surface of the inner case 12 adjacent to the optical path is allowed to appear. Moreover, the two side surfaces and the bottom surface are covered with a metal plate. Thus, the overall body of the inner case 12 is received and held by the fixing frame 13. That is, the fixing frame 13 which is holding the inner case 12 is formed into a double wall structure which has great mechanical strength. A lock-arm engaging hole 13a, to be described later, is formed at a lengthwise end of a bottom plate of the fixing frame 13. Edge portions 13f and 13g are prorivded with the two side surfaces.

Figure 3:
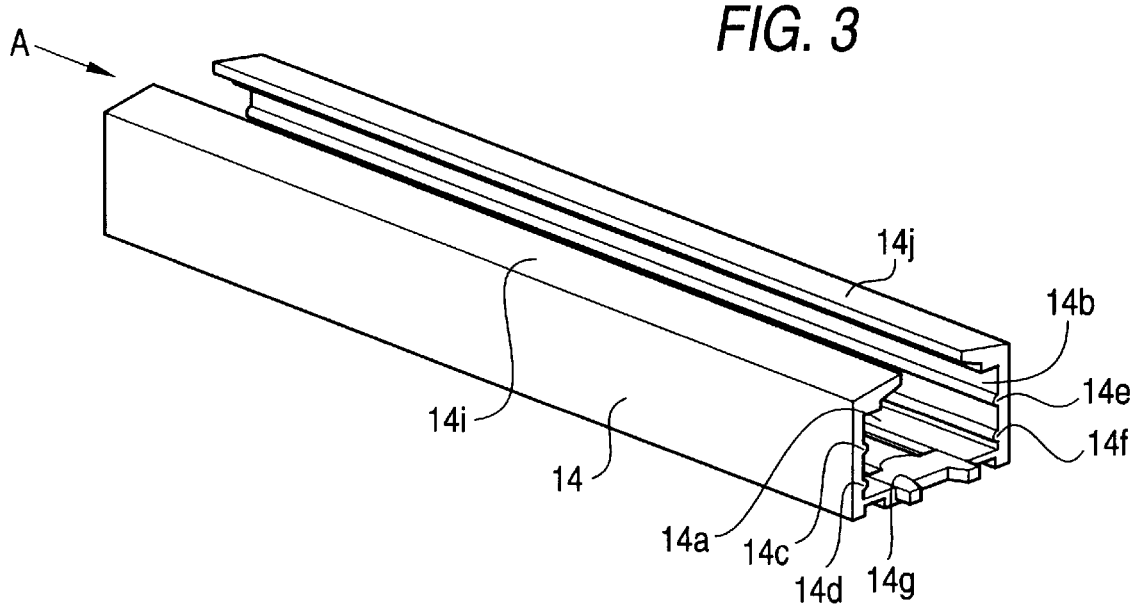
FIG. 3 is an exploded perspective view showing the outer case of the extension unit shown in FIG. 1.

FIG. 3 is a perspective view showing an outer case serving as a second case which is another element of the extension unit. An outer case 14 is formed into a groove shape by molding a metal material. Guide grooves 14a and 14b are formed in the two inner side surfaces of the outer case 14 at symmetrical positions. Guide projections 14c and 14d are formed on either of inner side surfaces of the outer case. Guide projections 14e and 14f are formed on the other inner side surface at symmetrical positions to the guide projections 14c and 14d. A spacer 14g is formed to project over a lengthwise end of the bottom plate of the outer case, in this embodiment, the spacer has two projections made of synthetic resin. The spacer 14g serves as a guide member when the units are connected to each other, while the spacer 14g having elasticity prevents looseness of the units after the units have been connected to each other.

Figure 4:
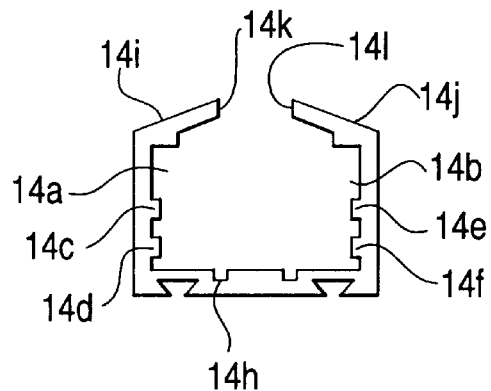
FIG. 4 is a front view from a direction of an arrow A shown in FIG. 3.

FIG. 4 is a front view of a direction of an arrow A shown in FIG. 3. Spacer-insertion holes 14h, into which the spacers of another unit adjacent in the direction of the thickness are inserted, are formed at an end of the bottom surface of the outer case opposite to the ends at which the spacer 14g is formed. Thus, the two projections of the connecting and guiding spacer are inserted into the spacer-insertion holes 14h so that the connection with the other unit is established. Edges 14k and 14l each having the same length as that of the stepped portions 12f and 12g formed on the surface of the inner case 12 are formed at the leading ends of inclined portions 14i and 14j continued from the two side surfaces of the outer case 14.

Figure 5:
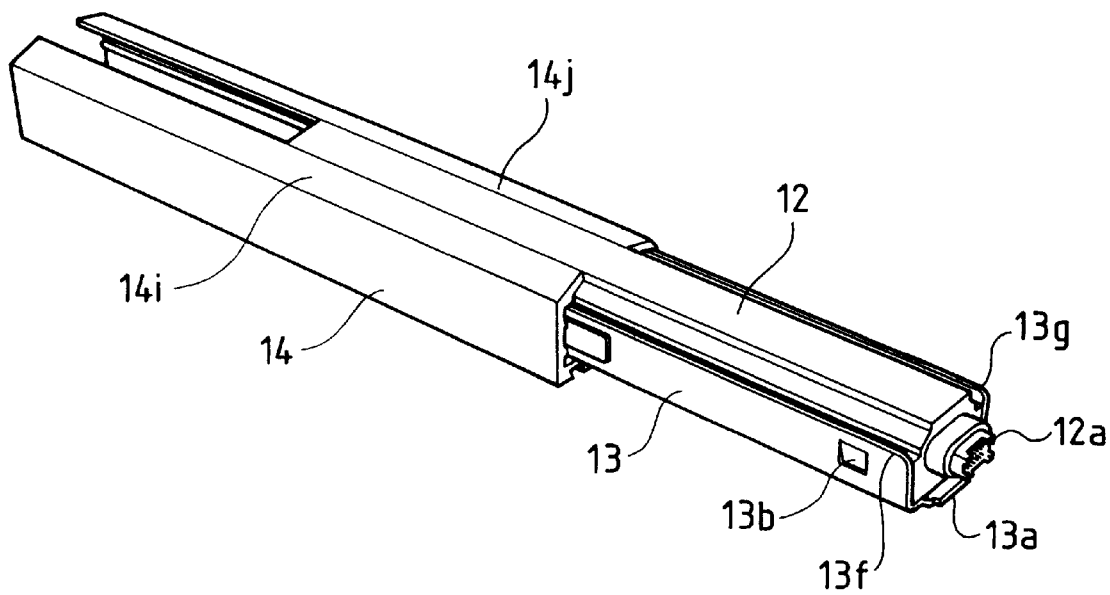
FIG. 5 is a perspective view showing the extension unit.

FIG. 5 is a perspective view showing an assembled state of the extension unit. The edge portions 13f and 13g of the fixing frame 13 which is holding the inner case 12 are brought into contact with the top surfaces of the guide grooves 14a and 14b of the outer case 14. Moreover, the two side surfaces of the fixing frame 13 are slid while the two side surfaces are brought into contact with the guide projections 14c to 14f of the outer case 14. Thus, the fixing frame 13 is inserted into a predetermined position on the inside of the outer case 14. The fixing frame 13 is secured by, for example, inserting a screw into the bottom surface of the outer case 14.

At this time, the stepped portions 12f and 12g formed on the two side surfaces of the inner case 12 and the inclined portions 14i and 14j of the outer case 14 are brought into contact with each other. Thus, the surface of the inner case 12 and the inclined portions 14i and 14j of the outer case 14 form a smooth and continuous surface of the extension unit. Thus, a portion of the fixing frame 13 projects over the outer case 14, the fixing frame 13 permitting the surface adjacent to the optical paths of the light emitting devices or the light receiving devices to appear and receiving and holding the overall body of the inner case 12. The residual portion of the fixing frame 13 is accommodated and secured in the outer case 14.

Figure 6:
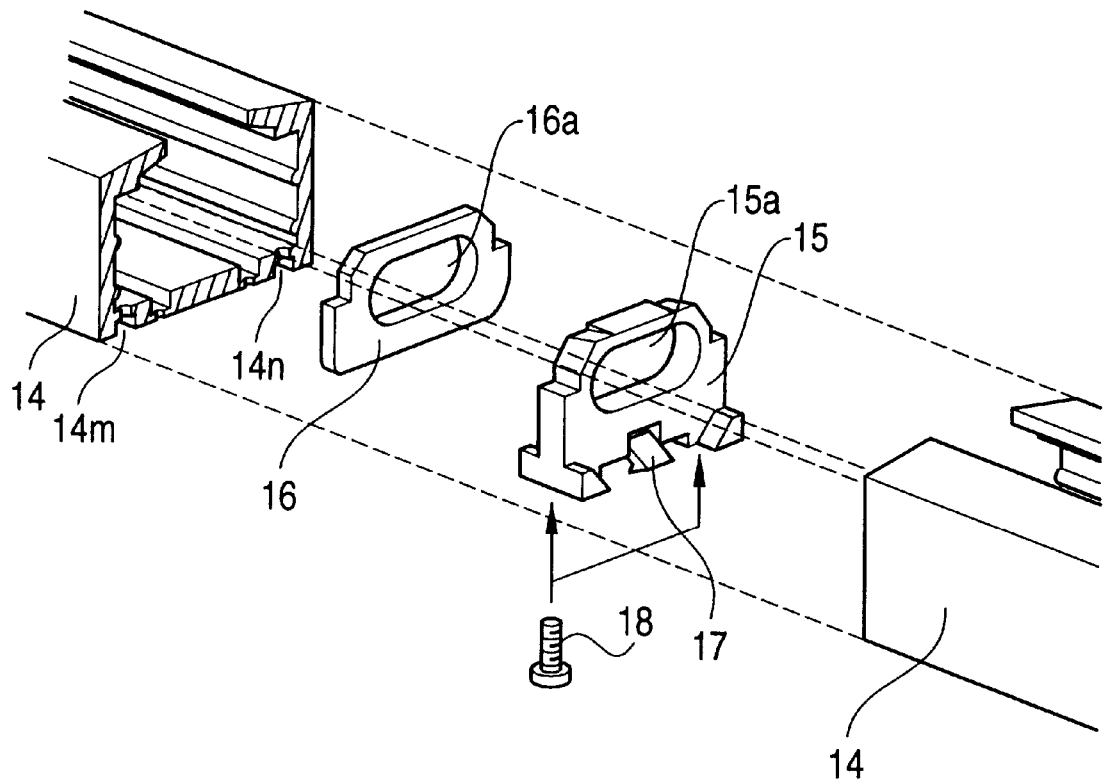
FIG. 6 is an exploded perspective view showing the position of a metal relay member.
Figure 7:
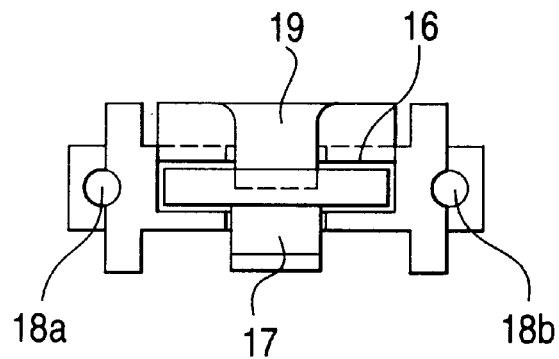
FIG. 7 is a bottom view of the metal relay member.

When the units are connected to each other, a metal relay member is employed. FIG. 6 is an exploded perspective view showing the metal relay member arranged to be joined in the outer case 14. FIG. 7 is a bottom view showing the metal relay member. A metal relay member 15 has an opening 15a in the central portion thereof. A lock arm 17 provided with elasticity by dint of a leaf spring 19 is joined to the lower portion of the metal relay member 15. A packing 16 is made of an elastic material, such as rubber, and has an opening 16a in the central portion thereof. The packing 16 is joined to the metal relay member 15.

Screws 18 are screwed in threaded holes 14m and 14n formed in the bottom surface of the outer case 14 and threaded holes 18a and 18b formed in the bottom surface of the metal relay member 15 so that the metal relay member 15 is secured to a position in the outer case 14. The male connector of the inner case 12 is disposed at the position of the metal relay member 15 secured in the outer case 14. When the inner case of the other unit has been inserted into the outer case 14 of the extension unit, the male connector formed at the end of the inner case of the other unit is allowed to pass through the opening 15a of the metal relay member 15 and the opening 16a of the packing 16. Thus, the foregoing male connector is electrically connected to the female connector of the extension unit. The packing 16 absorbs mechanical shock which is made when the connection with the other unit is established. Moreover, the packing 16 serves as dust and water proofing means for the connected portion between the two connectors.

When the other unit is connected, the lock arm 17 of the metal relay member 15 is pressed and moved upwards by the leading end of the lock-arm engaging hole formed in the bottom plate of the fixing frame of the other unit. Thus, the lock arm 17 moves over the bottom plate of the fixing frame while elasticity is given to the lock arm 17 from the leaf spring 19. Thus, the lock arm 17 is firmly engaged to the lock-arm engaging hole. The connecting and guiding spacer formed at either end of the bottom plate of the outer case 14 is inserted into a spacer-insertion hole formed at the leading end of the bottom plate of the outer case of the other unit. Thus, the extension unit and the other unit are electrically and mechanically connected to each other.

Figure 2:
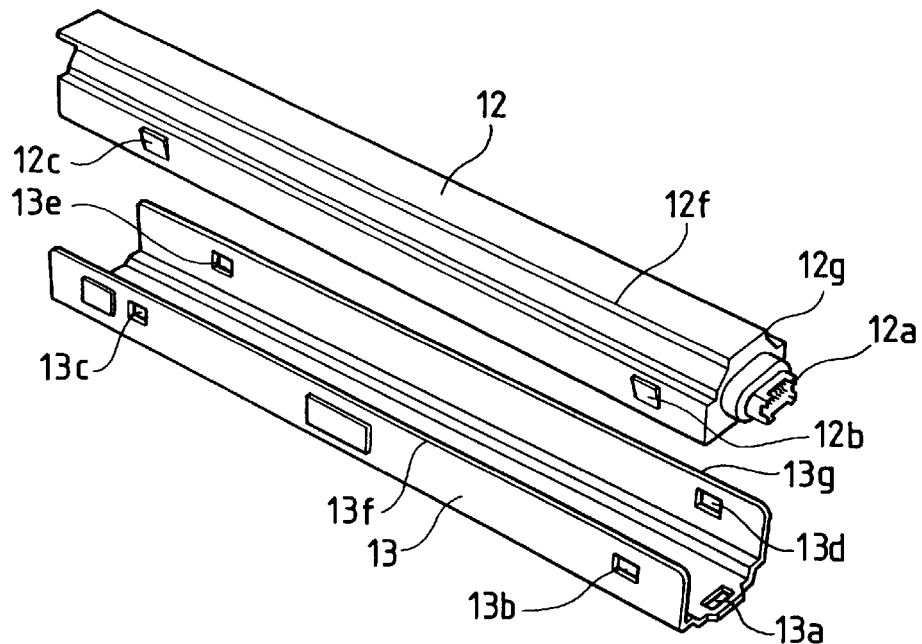
FIG. 2 is an exploded perspective view showing a portion of the extension unit shown in FIG. 1.

FIG. 1 is a diagram showing an assembled state of the multi-optical-path photoelectric switch according to the present invention. Referring to FIG. 1, the photoelectric switch includes a main unit 1, an extension unit 11 and an end unit 21. The main unit 1 incorporates an inner case 2 having a sealing member made of light transmissive synthetic resin to seal a required number of light emitting devices or light receiving devices; a fixing frame 3 for holding the inner case 2; an outer case 4 into which the fixing frame 3 is inserted; an end cover 5; a joining portion 6; and a lead wire 7.

A male connector 2a is disposed at an end of the inner case 2, while another end of the inner case 2 is connected to the lead wire 7 through the joining portion 6. Projections are formed on the two side surfaces of the inner case 2. The projections are engaged to engaging holes 3b formed in the two side surfaces of the fixing frame 3 so that the inner case 2 is secured to the fixing frame 3.

The cross sectional shape of the outer case 4 is the same as the cross sectional shape of the outer case 14 of the extension unit 11, that is, the cross sectional shape is the groove shape. Namely, guide grooves 4a and 4b are formed in the two inner side surfaces of the outer case 4 at symmetrical positions. Guide projections 4c and 4d are formed on either of the inner side surfaces of the outer case. Guide projections 4e and 4f are formed on the other inner side surface at symmetrical positions (the guide groove 4b and the guide projections 4e and 4f provided for the side surface are omitted from illustration). A spacer-insertion hole is formed at the leading end of the bottom surface at the opened-side end of the outer case 4. The projections of the connecting and guiding spacer of the adjacent extension unit are inserted into the spacer-insertion hole.

The other end of the outer case 4 is in close contact with the end surface of the end cover 5. The fixing frame 3 is secured with a screw or the like inserted into the bottom surfaces of the outer case 4 and the end cover 5. Inclined portions 5a and 5b are provided for the surface of the end cover 5 so that the surface of the inner case 2 and that of the end cover 5 form a smooth and continuous surface without any stepped portion.

The end unit 21 is provided with an end block 22, a metal-relay-member cover 23 and a joining portion 25. The end block 22 is provided with a male-connector joining substrate. Thus, the female connector and the male connector of the extension unit 11 are electrically connected to each other in the metal relay member. Thus, a member which must be joined is secured to the joining portion 25. The metal-relay-member cover 23 is made of a light transmissive synthetic resin material similar to the material of the inner cases 2 and 12. The surface of the metal-relay-member cover 23 and the inclined surface of the outer case 24 form a smooth and continuous surface without any stepped portion.

A spacer projecting in the lengthwise direction is formed on the bottom surface at an opened end of the outer case 24. The fixing frame 13 of the extension unit is inserted into the outer case 24 of the end unit 21. Moreover, the lock arm provided for the metal relay member of the end unit 21 is engaged to the lock-arm engaging hole 13a formed in the bottom plate of the fixing frame 13. In addition, the spacer provided for the bottom plate of the outer case 24 is inserted into the spacer-insertion hole formed in the bottom plate of the outer case 14 of the extension unit 11. Thus, the extension unit 11 and the end unit 21 are mechanically and electrically connected to each other.

Figure 8:
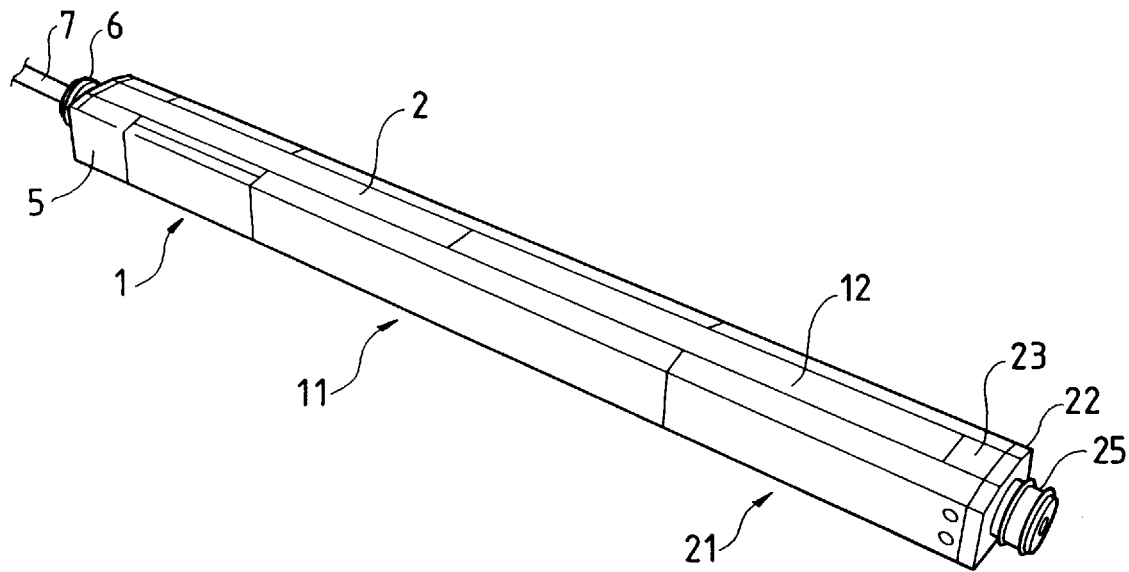
FIG. 8 is a perspective view showing the multi-optical-path photoelectric switch.

FIG. 8 is a perspective view of the multi-optical-path photoelectric switch mechanically and electrically connected as shown in FIG. 1. According to the present invention, adjacent units are connected to each other by the lock arm provided for the metal relay member disposed on the inside of the bottom surface of the outer case, the lock-arm engaging hole provided at the lengthwise end of the bottom plate of the fixing frame, the spacer formed at the lengthwise end of the bottom plate of the outer case and the spacer-insertion hole formed in the bottom plate of the outer case in the direction of the thickness.

The multi-optical-path photoelectric switch shown in FIGS. 1 and 8 has the structure that the overall body of the inner case (the first case) is received and held by the fixing frame having the U-shape cross sectional shape. Moreover, a portion of the fixing frame is allowed to project over the main unit or the extension unit. The residual portion of the fixing frame is accommodated in the outer case (the second case). Thus, the outer cases of the units are connected so that the number of optical paths or channels are varied. Therefore, when the units are connected to each other, the fixing frame which receives and holds the overall body of the inner case and which has the double wall structure is disposed to penetrate the outer cases of the adjacent units. Thus, the rigidity of the multi-optical-path photoelectric switch formed by connecting the units can be increased. Moreover, the mechanical durability against external oscillation and impact can be improved. Even if the overall length is elongated because the number of connected unit increases, the mechanical strength for maintaining the connection of the units can be increased.

The lock arm of the engaging member for connecting the units to each other, the connecting mechanism, such as the leaf spring for engaging and securing the lock arm to the engaging hole and the engaging hole are provided for the inside portion of the outer case without exception. Therefore, the connecting mechanisms do not project over the outer surface of the outer case. Thus, the outer surface of the multi-optical-path photoelectric switch can be smoothed.

Therefore, undesirable suspension of the mechanical and electrical connection of the units occurring because of contact of an object with the engaging member can be prevented. Since the engaging holes arranged to be engaged to the engaging members are not formed in the surface of each unit, satisfactory dust proof and water proof effects can be obtained.

In the example shown in FIG. 8, each of the main unit 1, the extension unit 11 and the end unit 21 are connected to one another. However, the end unit 21 may be connected to the main unit 1 to correspond to a required number of optical paths. Moreover, another structure may be employed in which a predetermined number of extension units are connected.

Figure 9:
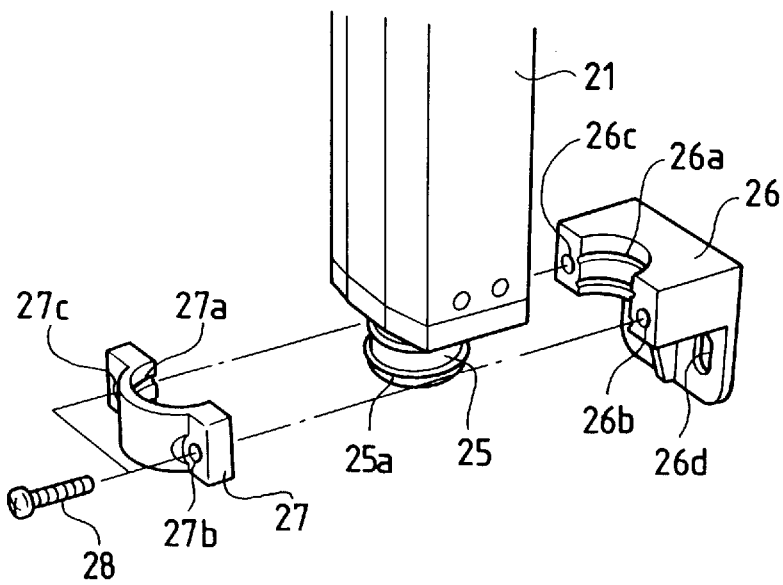
FIG. 9 is an exploded perspective view showing a joining portion of an end unit.
Figure 10:
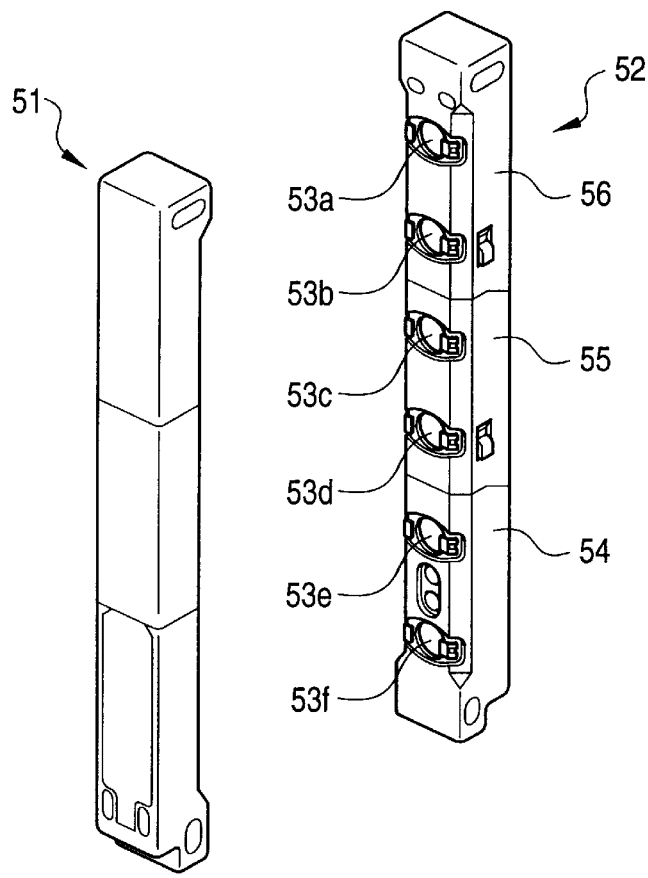
FIG. 10 is a perspective view of a conventional multi-optical-path photoelectric switch.
Figure 11:
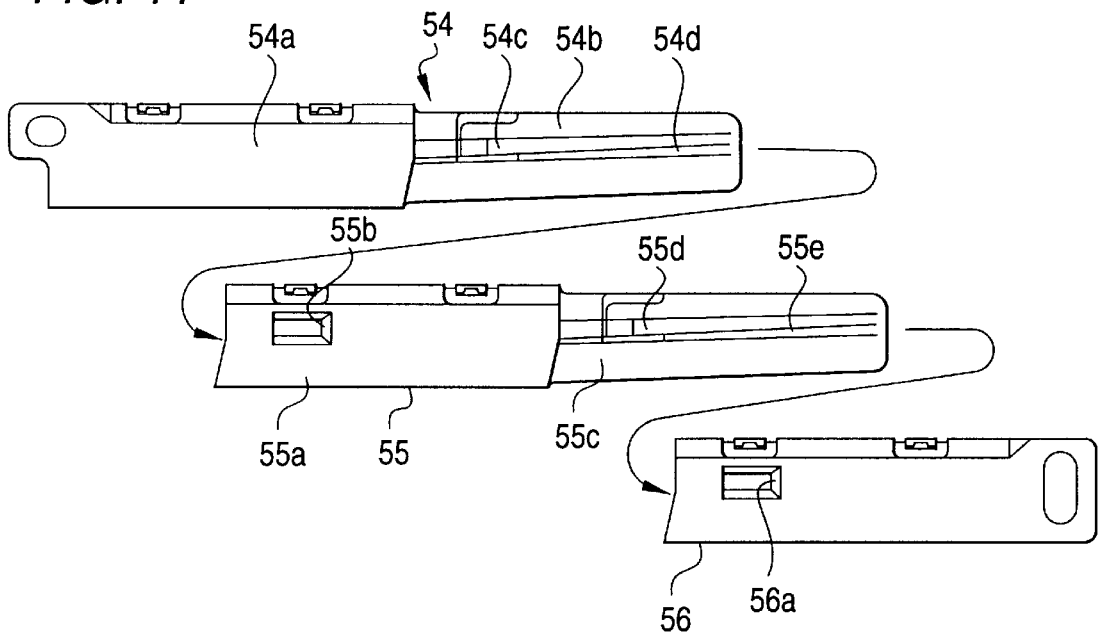
FIG. 11 is a diagram showing an assembled state of the conventional multi-optical-path photoelectric switch.

FIG. 9 is an exploded perspective view showing the joining member provided for the end unit. Referring to the drawing, An annular rib 25a projecting over the surface of the joining portion 25 of the end unit 21. A first joining member 26 is made of metal. A groove 26a for accommodating the rib 25a is formed in the inner surface of the first joining member 26 made of metal. Moreover, threaded holes 26b and 26c are formed at the end surfaces of the first joining member 26. A joining hole 26d has a predetermined size.

A second joining member 27 is made of metal and has a groove 27a for accommodating the rib 25a on the inner surface thereof. Moreover, threaded holes 27b and 27c are formed in the end surfaces of the second joining member 27. The first joining member 26 made of metal and the second joining member 27 made of metal which are arranged to be split members are joined to the joining portion 25 of the end unit 21 such that the rib 25a formed on the surface of the joining portion 25 is accommodated in the grooves 26a and 27a to locate the first and second joining members 26 and 27. Then, screws 28 are inserted into the threaded holes 27b and 26b and the threaded holes 27c and 26 so as to join the joining members to each other. Thus, the first joining member 26 and the second joining member 27 are secured to the joining portion 25 of the end unit 21. When the end unit 21 is secured to a support member, the end unit 21 can temporarily be joined while the weight of the end unit 21 is borne by the rib 25a and the grooves 26a and 27a.

The light receiving portions and the light emitting portions of the multi-optical-path photoelectric switch are disposed apart from one another for a predetermined distance. Then, screw-fixing is performed at the position of the joining hole 26d formed in the end unit so that the multi-optical-path photoelectric switch is secured to a support member, such as a frame or a joining frame.

Although the above-mentioned embodiment has the structure that the overall body of the inner case is made of the light transmissive synthetic resin, the inner case (the first case) is required such that the surface adjacent to the optical paths of the light emitting devices or the light receiving devices is made of the light transmissive resin material. The other portions are not required to be made of the light transmissive material.

As described above, the present invention has the structure that the overall body of the first case structured such that at least the surface adjacent to the optical paths of the light emitting devices or the light receiving devices is made of the light transmissive resin material is received and held by the fixing frame. Moreover, a portion of the fixing frame is accommodated by the second case. Thus, the units are formed. The units are mechanically and electrically connected to one another. Therefore, the fixing frame formed into a double wall structure because the fixing frame holds the first case is disposed to penetrate second cases of adjacent units. As a result, the rigidity of the multi-optical-path photoelectric switch constituted by connecting the units to one another can be increased. Moreover, durability against external oscillations and impact can be improved. Even if the number of units which must be connected is increased and thus the overall length is elongated, the mechanical strength for maintaining the connection among the units can be increased.

What is claimed is:

1. A multi-optical-path photoelectric switch comprising:
a light emtting portion having plural light emitting units, each including,
a predetermined number of light emitting devices for emitting lights,
a first case having a male connector disposed at one end, a female connector diposed at the other end, a surface between both ends made of a light transmissive resin, the surface through which the lights from the light emitting devices pass,
a fixing frame holding the first case, and having the substantialy same length as the first case, and
a second case accommodating a portion of the fixing frame while a residual portion of the fixing frrame is projected therefrom, wherein the light emitting units are mechanically and electrically connected to one another by inserting the portion of the fixing frame thus projected of either of adjacent light emitting units into the second case of the other adjacent light emitting unit; and
a light receiving portion having plural light receiving units, each including,
the same number of light receiving devices as the light emitting devices,
a first case having a male connector disposed at one end, a female connector diposed at the other end, a surface between both ends made of a light transmissive resin, the surface through which the lights pass to the light receiving devices,
a fixing frame holding the first case, and having the substantialy same length as the first case, and
a second case accommodating a portion of the fixing frame while a residual portion of the fixing frrame is projected therefrom, wherein the light receiving units are mechanically and electrically connected to one another by inserting the portion of the fixing frame thus projected of either of adjacent light receiving units into the second case of the other adjacent light receiving unit.

2. The multi-optical-path photoelectric switch according to claim 1, wherein the fixing frame is made of a metal.

3. The multi-optical-path photoelectric switch according to claim 1, wherein the portion of the fixing frame accommodated with the scond case of each light emitting units is a half length of whole fixing frame length, and the portion of the fixing frame accommodated with the scond case of each light receiving units is a half length of whole fixing frame length.

4. A multi-optical-path photoelectric switch comprising:
a pair of main units, each comprising,
a first case having a connector disposed at an end, a surface made of a light transmissive resin, for accommodating either of a first predetermined number of light emitting devices or the first predetermined number of light receiving devices,
a fixing frame holding the first case, and having the substantialy same length as the first case, and a second case accommodating a portion of the fixing frame while a residual portion of the fixing frrame near the connector is projected therefrom; and a pair of end units, each comprising, a end case having a length to accommodate the residual portion of the fixing frame of the respective main unit, and a connector for connecting the connector of the respective main unit.

5. The multi-optical-path photoelectric switch according to claim 4, further comprising:

a pair of extension unit, each comprising, a first case having connectors disposed at both ends, a surface made of a light transmissive resin, for accommodating either of a second predetermined number of light emitting devices or the second predetermined number of light receiving devices, a fixing frame holding the first case, and having the substantialy same length as the first case, and a second case accommodating a portion of the fixing frame while a residual portion of the fixing frame near the connector is projected from one end of the second case and the other end of the second case projects from the fixing frame having a substantially same length as the residual portion of the fixing frame, wherein the residual portion of the fixing frame of the main unit is inserted into the second case of the extension unit, the connector of the main unit connects to the one of the connectors of the extension unit, the residual portion of the fixing frame of the extension unit is inserted into the end case of the end unit, and the other of the connectors of the extension unit connects to the connector of the end unit, so that the main unit, the extension unit, and the end unit mechanically and electrically connect in that order.

6. The multi-optical-path photoelectric switch according to claim 5, the extension units have plural pairs to connect in series.

7. The multi-optical-path photoelectric switch according to claim 4, wherein the fixing frames are made of a metal.

* * * * *